US012642154B2

(12) United States Patent
Gildea et al.

(10) Patent No.: US 12,642,154 B2
(45) Date of Patent: May 26, 2026

(54) METHODS AND DEVICES FOR IMPROVING BOND STRENGTH OF DIFFUSION BARRIERS

(71) Applicant: Tokyo Electron Limited, Tokyo (JP)

(72) Inventors: Adam Gildea, Albany, NY (US); Satohiko Hoshino, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 449 days.

(21) Appl. No.: 18/370,840

(22) Filed: Sep. 20, 2023

(65) Prior Publication Data

US 2025/0096190 A1 Mar. 20, 2025

(51) Int. Cl.

*H10W 99/00* (2026.01)
*H10W 72/00* (2026.01)
*H10W 80/00* (2026.01)

(52) U.S. Cl.

CPC ......... *H10W 99/00* (2026.01); *H10W 72/019* (2026.01); *H10W 72/01961* (2026.01); *H10W 80/312* (2026.01); *H10W 80/327* (2026.01)

(58) Field of Classification Search

CPC . H01L 2224/80896; H01L 2224/80895; H01L 24/80; H01L 24/03
See application file for complete search history.

(56) References Cited

U.S. PATENT DOCUMENTS

2005/0173057 A1 8/2005 Suga et al.
2011/0129986 A1* 6/2011 Libralesso .......... H01L 21/2007 438/455
2014/0117546 A1 5/2014 Liu et al.
2022/0139867 A1 5/2022 Uzoh

FOREIGN PATENT DOCUMENTS

JP 2017-135397 8/2017
KR 10-2016-0144315 A 12/2016

OTHER PUBLICATIONS

International Search Report and Written Opinion on International Application No. PCT/US2024/038941 dated Oct. 25, 2024 (9 pages).

* cited by examiner

*Primary Examiner* — William B Partridge
*Assistant Examiner* — Mehek Ahmed
(74) *Attorney, Agent, or Firm* — Foley & Lardner LLP

(57) ABSTRACT

Semiconductor devices and corresponding methods of manufacture are disclosed. The methods include forming a first layer on a first substrate, treating the first layer with a nitrogen-based plasma to form a first type of dangling bonds, treating the first layer with an oxygen-based plasma to transform the first type of dangling bonds into a second type of dangling bonds, and treating the first layer with water to transform the second type of dangling bonds into a third type of dangling bonds.

20 Claims, 17 Drawing Sheets

300

300

700

700

900

1000

1000

1000

1500

1500

1700

METHODS AND DEVICES FOR IMPROVING BOND STRENGTH OF DIFFUSION BARRIERS

TECHNICAL FIELD

This disclosure generally relates to methods for fabricating semiconductor devices, and more particularly to improving bond strength of diffusion barriers.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. While semiconductor devices have scaled down with their feature sizes decreased and aspect ratios increased, such scaling efforts are running into greater challenges as scaling enters single digit nanometer semiconductor device fabrication processes. Although nanoscale semiconductor fabrication processes have been successfully demonstrated and implemented, various embodiments can include numerous operations, and may include increasing stability of semiconductor device element or features.

SUMMARY

The present disclosure relates to methods and structures of improving bond strength of diffusion barriers. The methods disclosed herein may include forming dangling bonds, bonding the dangling bonds, and forming oxides thereby. The methods, structures, and techniques described herein provide improved bond strength of diffusion barriers, thereby enhancing the performance reliability of devices.

One aspect of the present disclosure can be directed to a method for fabricating semiconductor devices. The method includes forming a first layer on a first substrate; treating the first layer with a nitrogen-based plasma to form a first type of dangling bonds; treating the first layer with an oxygen-based plasma to transform the first type of dangling bonds into a second type of dangling bonds; and treating the first layer with water to transform the second type of dangling bonds into a third type of dangling bonds.

In some examples, the method includes forming a second layer on a second substrate; treating the second layer with a nitrogen-based plasma to form the first type of dangling bonds; treating the second layer with an oxygen-based plasma to transform the first type of dangling bonds into the second type of dangling bonds; and treating the second layer with water to transform the second type of dangling bonds into the third type of dangling bonds.

In some examples, the method includes bonding the first substrate and the second substrate such that the third type of dangling bonds of each substrate forms a third layer between the first layer and the second layer.

In some examples, the third layer is an oxide layer.

In some examples, the first layer is a nitride-based material; the first type of dangling bonds is a nitrogen-based dangling bond; the second type of dangling bonds is an oxygen-based dangling bond; and the third type of dangling bonds is a hydroxide-based dangling bond. In some examples, the nitride-based material is at least one of SiCN, SiN, BN, AlN, TiN, or TaN.

In some examples, the bonding of the first substrate and the second substrate is performed by a wafer-to-wafer bonding or by a die-to-wafer bonding.

Another aspect of the present disclosure can be directed to a method for fabricating semiconductor devices. The method includes forming a first layer on a first substrate; forming a second layer on a second substrate; forming a first type of dangling bonds on the first layer of the first substrate and on the second layer of the second substrate; transforming the first type of dangling bonds on the first layer of the first substrate and on the second layer of the second substrate into a second type of dangling bonds; transforming the second type of dangling bonds on the first layer of the first substrate and on the second layer of the second substrate into a third type of dangling bonds; and bonding the third type of dangling bonds on the first layer of the first substrate with the third type of dangling bonds on the second layer of the second substrate.

In some examples, the bonding of the third type of dangling bonds on the first layer of the first substrate and the third type of dangling bonds on the second layer of the second substrate forms a third layer.

In some examples, the third layer is an oxide layer.

In some examples, the method includes treating the first layer and the second layer with a $N_2$ plasma to form the first type of dangling bonds; treating the first type of dangling bonds with an $O_2$ plasma to transform the first type of dangling bonds into the second type of dangling bonds; and treating the second type of dangling bonds with water to transform the second type of dangling bonds into the third type of dangling bonds.

In some examples, the first type of dangling bonds is a nitrogen-based dangling bond; the second type of dangling bonds is an oxygen-based dangling bond; and the third type of dangling bonds is a hydroxide-based dangling bond.

Another aspect of the present disclosure can be directed to a method for fabricating semiconductor devices. The method includes forming a dielectric material on a first portion of a first substrate; forming the dielectric material on a first portion of a second substrate; forming a conductive material on a second portion of the first substrate; forming the conductive material on a second portion of the second substrate; forming dangling bonds on the first portion of the first substrate; forming dangling bonds on the first portion of the second substrate; and bonding the first substrate and the second substrate such that at least one of the dangling bonds on the first portion of the first substrate bonds with at least one of the dangling bonds on the first portion of the second substrate to form an oxide.

In some examples, the forming of dangling bonds on the first portion of the first substrate and the forming of dangling bonds on the first portion of the second substrate include forming nitrogen-based dangling bonds on the dielectric material on the first portion of the first substrate and on the dielectric material on the first portion of the second substrate; transforming the nitrogen-based dangling bonds into oxygen-based dangling bonds; and transforming the oxygen-based dangling bonds into hydroxide-based dangling bonds.

In some examples, the method includes treating the dielectric material on the first portion of the first substrate and on the dielectric material on the first portion of the second substrate with an $N_2$ plasma to form the nitrogen-based dangling bonds; treating the nitrogen-based dangling bonds with an $O_2$ plasma to transform the nitrogen-based dangling bonds into the oxygen-based dangling bonds; and treating the oxygen-based dangling bonds with water to transform the oxygen-based dangling bonds into the hydroxide-based dangling bonds.

In some examples, the method includes forming an interconnect material on a bottom portion and sidewalls of the second portion of the first substrate; and forming the interconnect material on a bottom portion and sidewalls of the second portion of the second substrate.

In some examples, the interconnect material formed on the second portion of the first substrate, the interconnect material formed on the second portion of the second substrate, and the oxide form a diffusion barrier.

In some examples, the interconnect material formed on the second portion of the first substrate is connected to the interconnect material formed on the second portion of the second substrate through the oxide.

In some examples, the oxide prevents the conductive material in the second portion of the first substrate from diffusing into the first portion of the second substrate.

In some examples, the dielectric material comprises tetraethyl orthosilicate and at least one of SiCN, SiN, BN, AlN, TiN, or TaN.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

These and other aspects and implementations are discussed in detail below. The foregoing information and the following detailed description include illustrative examples of various aspects and implementations and provide an overview or framework for understanding the nature and character of the claimed aspects and implementations. The drawings provide illustrations and a further understanding of the various aspects and implementations and are incorporated in and constitute a part of this specification. Aspects can be combined, and it will be readily appreciated that features described in the context of one aspect of the invention can be combined with other aspects. Aspects can be implemented in any convenient form. As used in the specification and in the claims, the singular form of "a," "an," and "the" include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of clarity, not every component may be labeled in every drawing. In the drawings.

DETAILED DESCRIPTION

Figure 1:
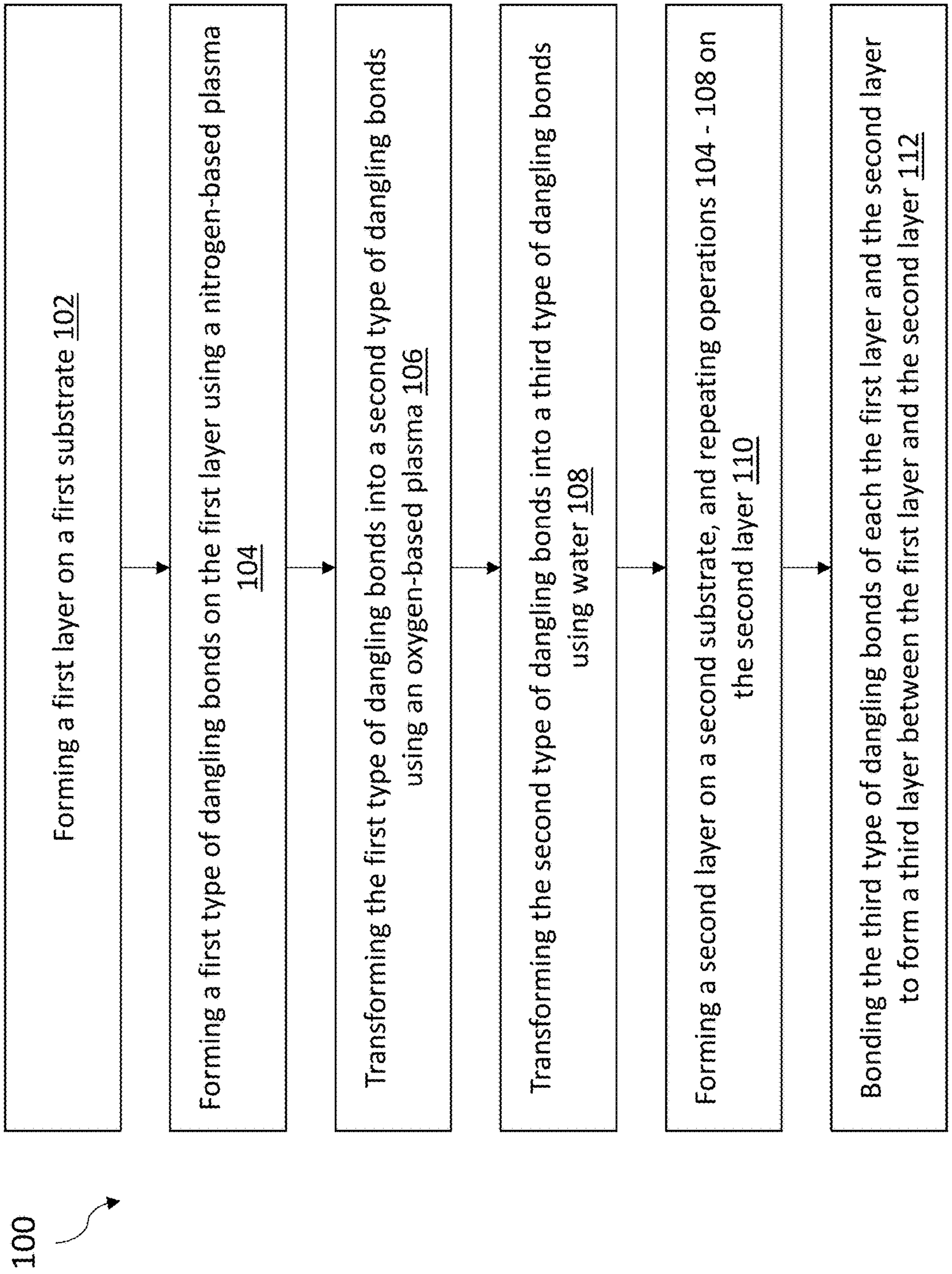
FIG. 1 shows a flow chart of a method for fabricating a semiconductor device, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

Techniques herein include methods and devices for improving bond strength of diffusion barriers in a semiconductor device. Specifically, techniques include using sequential plasma treatment to modify the surface (e.g., forming and/or transforming dangling bonds) of known barriers thereby improving bonding behavior and/or forming interlayer diffusion barriers (e.g., forming oxide) while maintaining diffusion barrier performance. This allows for improved bond strength of diffusion barriers (e.g., improved interfacial barrier material bond strength). Accordingly, diffusion of conductive materials can be more effectively prevented. Techniques herein can be applied to wafer-to-wafer (W2W) bonding, die-to-wafer (D2W) bonding, etc.

Reference will now be made to the figures, which for the convenience of visualizing the fabrication techniques described herein, illustrate a variety of materials undergoing a process flow in various views. Unless expressly indicated otherwise, each Figure represents one (or a set) of fabrication steps in a process flow for manufacturing the devices described herein. In the various views of the Figures, connections between conductive layers or materials may or may not be shown. However, it should be understood that connections between various layers, masks, or materials may be implemented in any configuration to create electric or electronic circuits. When such connections are shown, it should be understood that such connections are merely illustrative and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, the techniques described herein may be implemented in any shape or geometry for any material or layer to achieve desired results. In addition, examples in which two transistors or devices are shown stacked on top of one another are shown for illustrative purposes only, and for the purposes of simplicity. Indeed, the techniques described herein may provide for one to any number of stacked devices. Further, although the devices fabricated using these techniques are shown as transistors, it should be understood that any type of electric electronic device may be manufactured using such techniques, including but not limited to transistors, variable resistors, resistors, and capacitors.

FIG. 1 illustrates a flow chart of a method 100 for fabricating a semiconductor device, in accordance with some embodiments. It is noted that the method 100 is merely an example, and is not intended to limit the present disclosure. Accordingly, it is understood that additional operations may be provided before, during, and after the method 100 of FIG. 1, that any operation may be omitted, and that some other operations may only be briefly described herein.

In various embodiments, operations of the method 100 may be associated with cross-sectional views of an example structure at various fabrication stages as shown in FIGS. 3 to 8, which will be discussed in further detail below. It should be understood that the structure, shown in FIGS. 3 to 8, may include a number of other structures, while remaining within the scope of the present disclosure.

In brief overview, the method 100 starts with operation 102 of forming a first layer on a first substrate. The method 100 continues to operation 104 of forming a first type of dangling bonds on the first layer using a nitrogen-based plasma (e.g., $N_2$). The method 100 can proceed to operation 106 of transforming the first type of dangling bonds into a second type of dangling bonds using an oxygen-based plasma. The method 100 can proceed to operation 108 of transforming the second type of dangling bonds into a third type of dangling bonds using water. The method 100 can proceed to operation 110 of forming a second layer on a second substrate, and repeating operations 104-108 on the second layer. The method 100 can proceed to operation 112 of bonding the third type of dangling bonds of each the first layer and the second layer to form a third layer between the first layer and the second layer.

Figure 3:
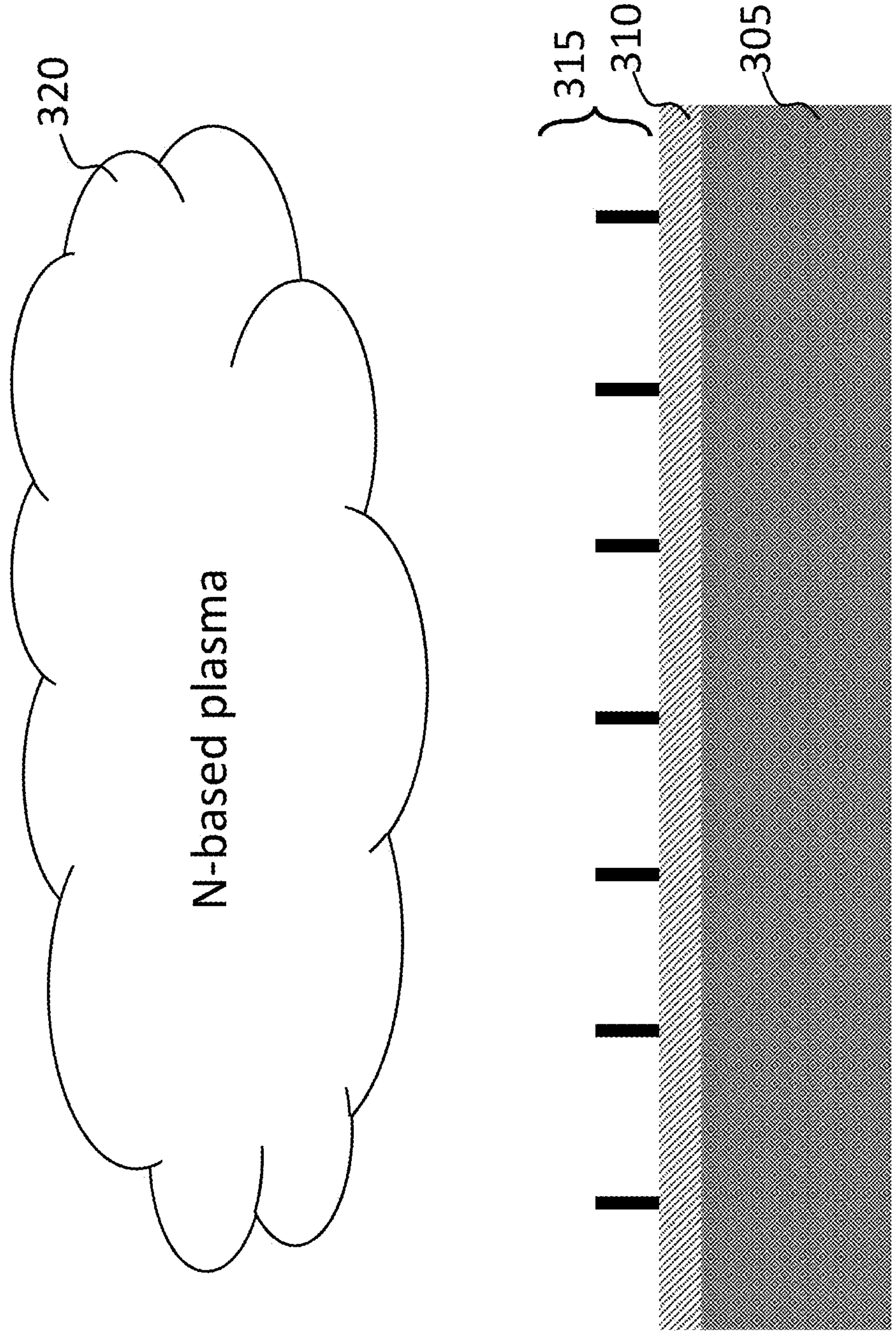
FIGS. 3-17 show views of a semiconductor device during various fabrication stages, according to some embodiments.

Corresponding to operation 102 of FIG. 1, FIG. 3 is a cross-sectional view of a structure 300 in which a first layer 310 of a first material is formed over a substrate 305.

The substrate 305 may be a semiconductor substrate, such as a bulk semiconductor, a semiconductor-on-insulator (SOI) substrate, or the like, which may be doped (e.g., with a p-type or an n-type dopant) or undoped. The substrate 305 may be a wafer, such as a silicon wafer. Other substrates, such as a multi-layered or gradient substrate may also be used. In another example, the substrate 305 may be an intermetal dielectric (e.g., silicon oxide or otherwise low-k dielectric material). In yet another example, the substrate 305 may be a portion of a 3D NAND memory device, and the substrate 305 may include a stack of different dielectric materials (e.g., oxide-nitride-oxide-nitride (ONON)) alternately arranged on top of one another. The thickness of such a stack layer may vary. For example, the thickness of the ONON layer may be around 8 μm.

The substrate 305 includes a semiconductor material, such as a bulk semiconductor, a semiconductor-on-insulator (SOI), or the like, which may be doped (e.g., with a p-type or an n-type dopant) or undoped. The substrate 305 may be or correspond to a wafer, such as a silicon wafer. Generally, an SOI includes a layer of a semiconductor material formed on an insulator layer. The insulator layer may be, for example, a buried oxide (BOX) layer, a silicon oxide layer, or the like. The substrate 305 may include other semiconductor materials, such as a multi-layered or gradient semiconductor material. In some examples, the substrate 305 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIG. 3, the first layer 310 can be formed over the substrate 305. The first layer 310 and the various additional dielectric and conductive layers and materials herein can be placed, grown, (e.g., epitaxially with or without a seed layer), or otherwise formed to create layers of the structure 300. The formation of the various layers of the structure 300 can include planarization of the layers, such as by cutting, ablation, chemical mechanical grinding or polishing (CMG/P), or other planarization techniques. The first layer 310 can be or include a material which can be selectively etched, relative to one or more adjacent materials, such as the substrate 305. The first layer 310 may be or include a nitride layer, including SiCN, SiN, AlN, BN, TiN, TaN, etc. The first layer 310 may be formed or deposited using at least one suitable deposition technique, such as chemical vapor deposition (CVD), flowable CVD (FCVD), atomic layer deposition (ALD), spin coating, the like, or combinations thereof.

Although not depicted for the sake of simplicity, the structure 300 may include a number of front-end-of-line (FEOL) device features (e.g., transistors, diodes, resistors, etc.) in and/or over the structure 300 and a number of interconnect structures (alternatively referred to as conductive features, such as vias and conductive lines) formed over the device features. Example transistors may include field-effect transistors (FETs) such as fin-like FET (e.g., FinFET), multi-gate FETs, nanosheet FETs, the like, or combinations thereof. The interconnect structures may be configured to electrically connect the device features to one another so as to form an integrated circuit (IC), which can function as a logic device, a memory device, an input/output device, or the like. The device features may include doped or undoped semiconductor materials, which may be similar in composition as the structure 300.

Corresponding to operation 104 of FIG. 1, FIG. 3 shows the structure 300 in which a first type of dangling bonds 315 is formed on the first layer 310. The first type of dangling bonds 315 may be or include a nitrogen dangling bond. The first type of dangling bonds 315 can be formed on the first layer 310 using a nitrogen-based plasma 320. In some examples, the first layer 310 can be treated with the nitrogen-based plasma under various conditions (e.g., plasma activation conditions). For example, a pressure may be the atmospheric pressure to a pressure of around $5\times10^{-3}$ Torr. For example, a power level for activating the plasma may be around 50 to 1000 W.

Figure 4:
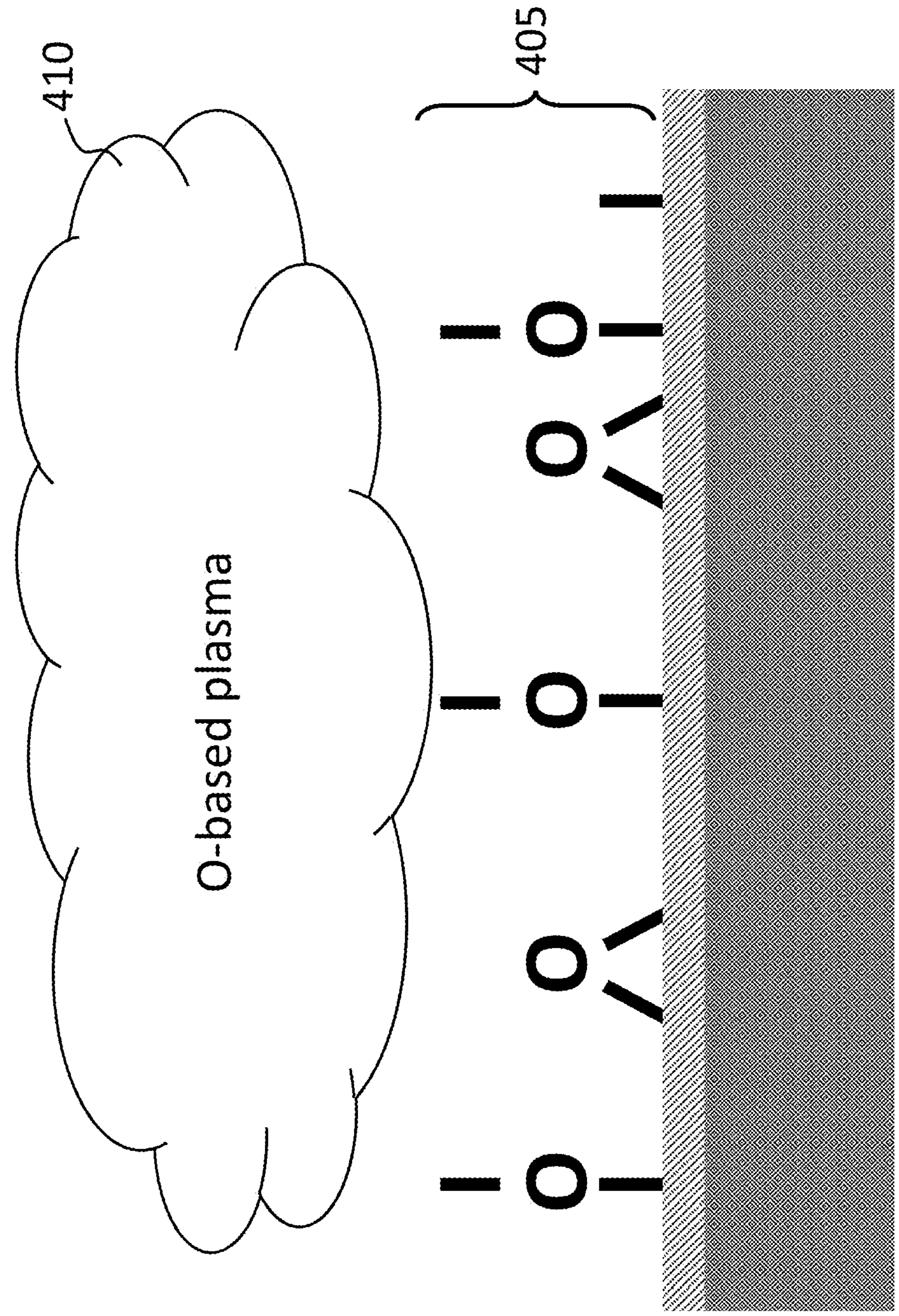

Corresponding to operation 106 of FIG. 1, FIG. 4 shows the structure 300 in which a second type of dangling bonds 405 is formed on the first layer 310. The second type of dangling bonds 405 may be or include an oxygen dangling bond, as shown in FIG. 4. The second type of dangling bonds 405 can be formed on the first layer 310 using an oxygen-based plasma 410, for example, by transforming the first type of dangling bonds 315. In some examples, when the operation 104 is omitted, the second type of dangling bonds 405 can be directly formed on the first layer 310.

In some examples, performing the operation 106 may include applying an oxidizer in a gaseous or plasma to the first layer 310 (e.g., the first type of dangling bonds 315 formed thereon) to chemically transform the first type of dangling bonds 315 into the second type of dangling bonds 405, thereby modifying the surface chemistry and/or the surface energy of the first layer 310. The oxidizer that can be applied during the operation 106 may be or include $O_2$ (e.g., $O_2$ plasma), $O_3$ (e.g., $O_3$ plasma), the like, or combinations thereof.

Figure 5:
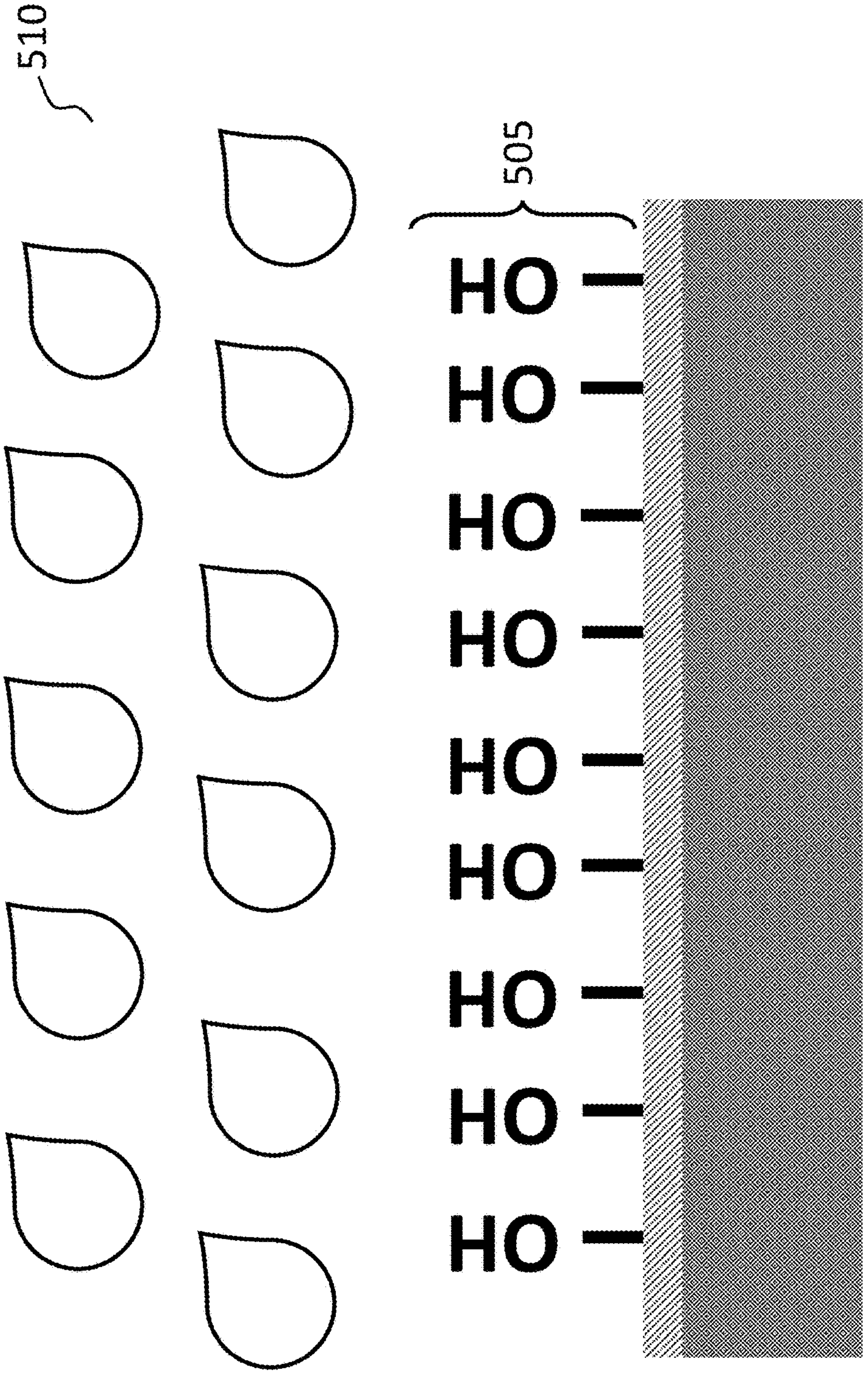

Corresponding to operation 108 of FIG. 1, FIG. 5 shows the structure 300 in which a third type of dangling bonds 505 is formed on the first layer 310. The third type of dangling bonds 505 may be or include a hydroxide dangling bond, as shown in FIG. 5. The third type of dangling bonds 505 can be formed on the first layer 310 using water treatment 510 (e.g., scrubber rinse), for example, by transforming/hydroxilizing the second type of dangling bonds 405. In some examples, when the operation 104 and the operation 106 are omitted, the third type of dangling bonds 505 can be directly formed on the first layer 310. The third type of dangling bonds 505 can provide active sites where chemical reactions involving formation of an oxide can occur.

In some examples, the third type of dangling bonds 505 may include a hydroxyl group of dangling bonds, which can be formed by, for example, transforming the second type of dangling bonds 410. The third type of dangling bonds 505 can be coupled to the first layer 310 via an adsorption process, such as water molecules (in the form of water vapor in ambient air) adsorbing onto the first layer 310. In this regard, the third type of dangling bonds 505 can be coupled to the first layer 310 by virtual of exposure in ambient air.

In some examples, performing the operation 108 may include applying an oxidizer in a gaseous or plasma to the first layer 310 (e.g., the second type of dangling bonds 405 formed thereon) to chemically transform the second type of dangling bonds 405 into the third type of dangling bonds 505, thereby modifying the surface chemistry and/or the surface energy of the first layer 310. The oxidizer that can be applied during the operation 108 may be or include $H_2O$ (e.g., liquid or vaporized $H_2O$), etc.

Figure 6:
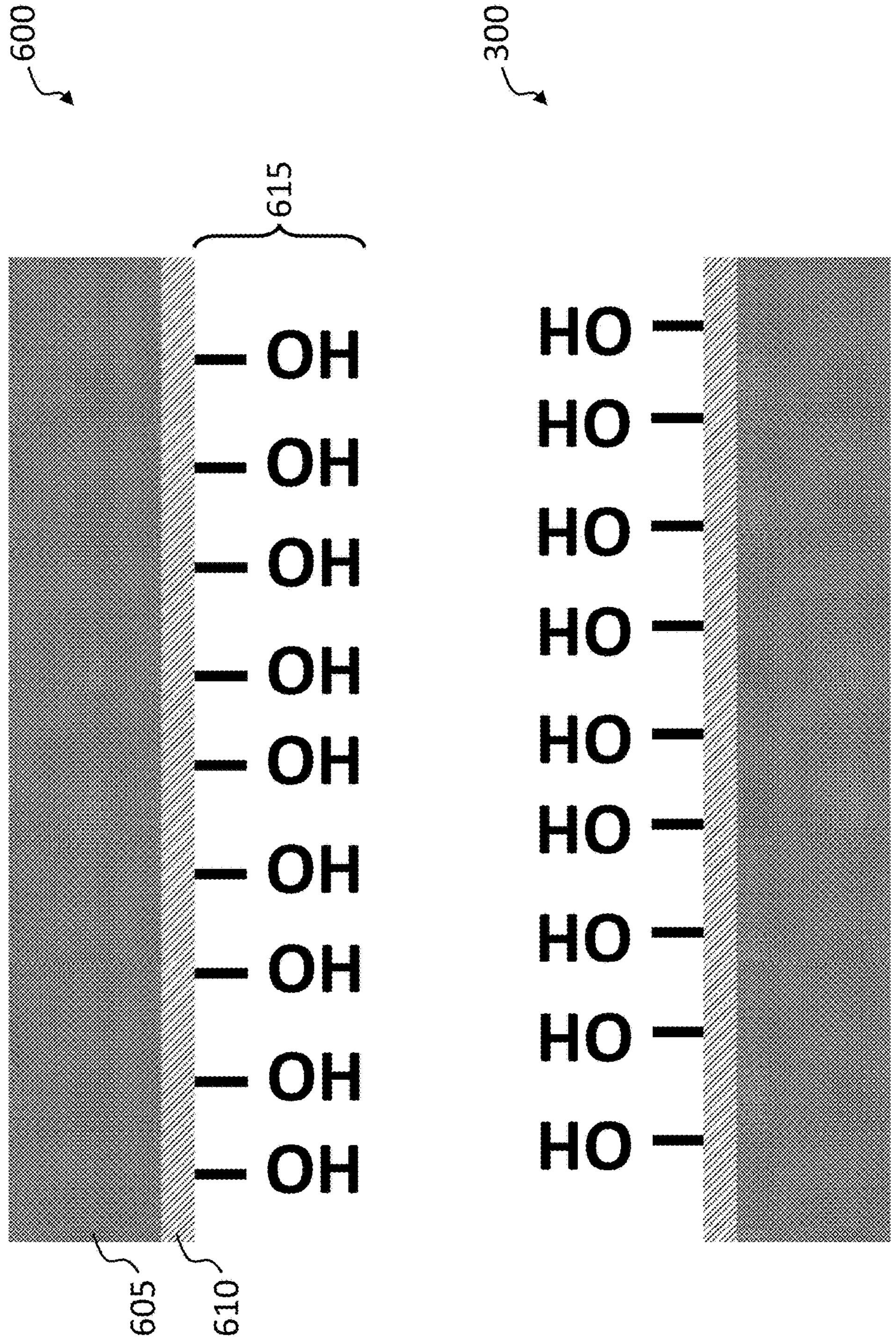

Corresponding to operation 110 of FIG. 1, FIG. 6 shows a cross-sectional view of the structure 300 and a second structure 600. In the operation 110, the operation 104 to the operation 108 are repeated on the second structure 600. More specifically, the second structure 600 includes a second substrate 605 and a second layer 610. The second substrate 605 is substantially similar to or identical to the substrate 305. The second layer 610 is substantially similar to or identical to the first layer 310. As shown in FIG. 6, in the operation 110, a third type of dangling bonds 615 is formed on the second layer 610 of the second structure 600.

Figure 7:
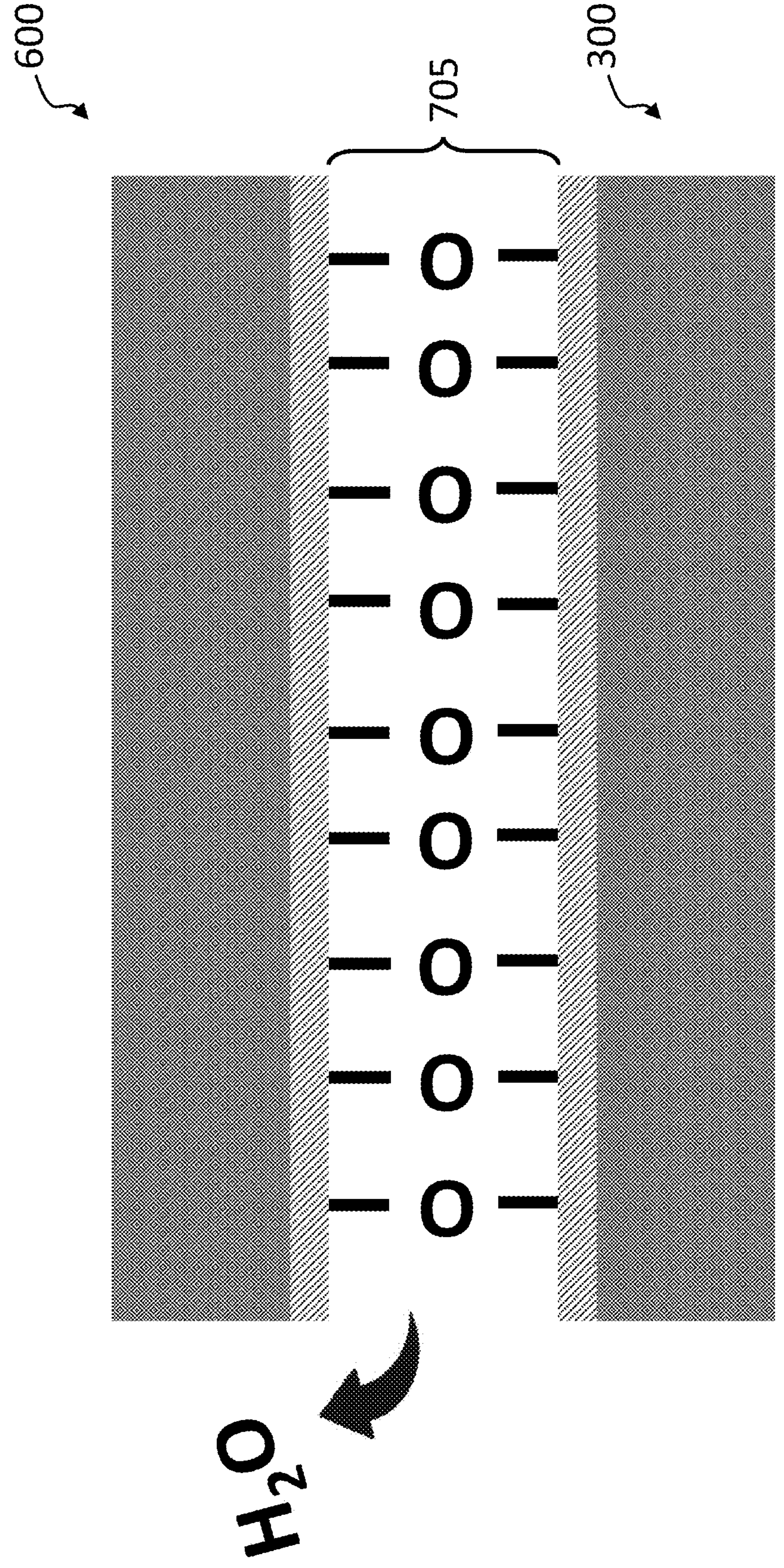

Corresponding to operation 112 of FIG. 1, FIG. 7 shows a cross-sectional view of a bonded structure 700, which can be formed by bonding the structure 300 and the second structure 600. More specifically, in the operation 112, the third type of dangling bonds 505 of the structure 300 and the third type of dangling bonds 615 of the second structure 600 are bonded to form oxide bonds 705.

In the operation 112, before bonding the structure 300 and the second structure 600, the second structure 600 (or the structure 300) is flipped or inverted (e.g., rotated 180°) such that the third type of dangling bonds 615 of the second structure 600 and the third type of dangling bonds 505 of the structure 300 are placed opposite one another in a face-to-face (e.g., frontside-to-frontside) configuration. For example, the third type of dangling bonds 615 of the second structure 600 and the third type of dangling bonds 505 of the structure 300 are bonded such that the third type of dangling bonds (e.g., their respective hydroxyl groups) are disposed in close proximity to one another in preparation for the operation 112.

The operation 112 includes aligning and bonding the third type of dangling bonds 615 of the second structure 600 and the third type of dangling bonds 505 of the structure 300 to form a third layer 805 (or an interface) between the first layer 310 and the second layer 610. The alignment and bonding of the third type of dangling bonds 615 of the second structure 600 and the third type of dangling bonds 505 of the structure 300 may be performed according to any suitable process, such as a hybrid bonding process, a fusion bonding process, or a direct bonding process.

As a result of the operation 112, $H_2O$ can be formed as a byproduct and separated out from the bonded structure 700. Referring to FIG. 7, the operation 112 is applied to make physical and direct contact between the third type of dangling bonds 615 of the second structure 600 and the third type of dangling bonds 505 of the structure 300, resulting in their third type of dangling bonds (e.g., the hydroxyl groups) to chemically react according to Scheme I below:

$$*(OH) + *(OH) \longrightarrow {}^{*}O^{*} + H_2O, \qquad (I)$$

where the symbol "*" represents a partial bond (e.g., covalent bond) and each *(OH) corresponds to a hydroxyl group in the third type of dangling bonds 615 of the second structure 600 and the third type of dangling bonds 505 of the structure 300, respectively. The reaction product according to Scheme I includes *O*, which represents the oxide bonds 705 (or an oxygen-containing covalent linkage, etc.) between the first layer 310 and the second layer 610.

Figure 8:
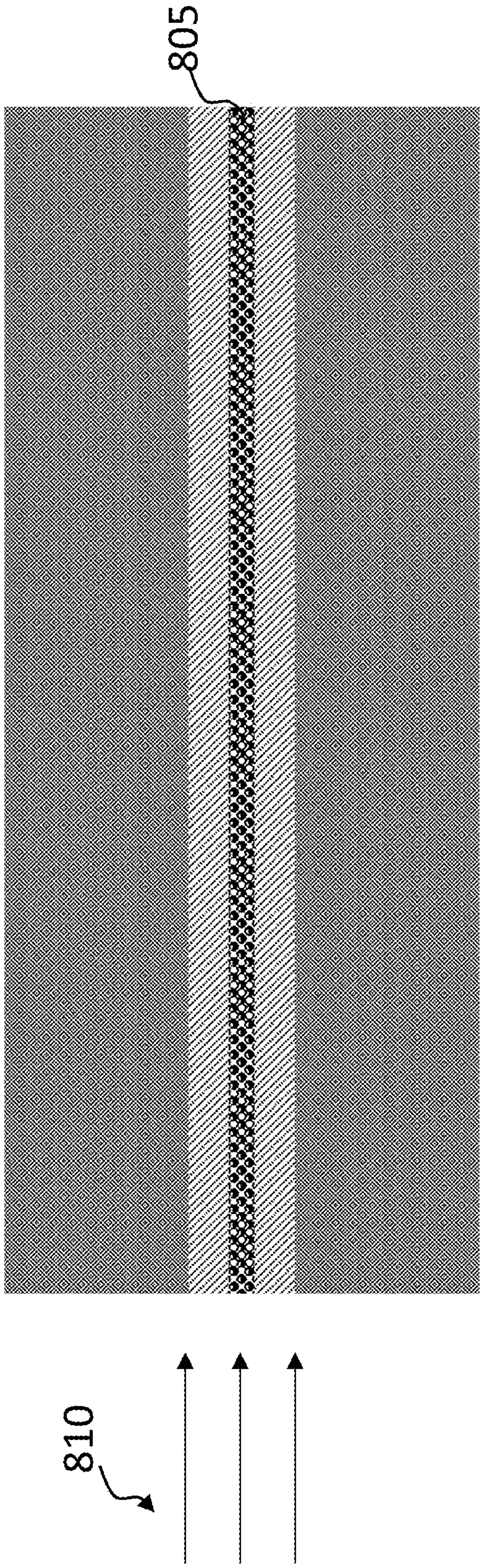

Accordingly, now referring to FIG. 8, a third layer 805 can be formed between the first layer 310 and the second layer 610. In some examples, the operation 112 may include performing thermal treatment (e.g., an annealing process) 810 to anneal the bonded structure 700, thereby allowing the oxide bonds 705 to form the third layer 805 (e.g., an oxide layer).

Figure 2:
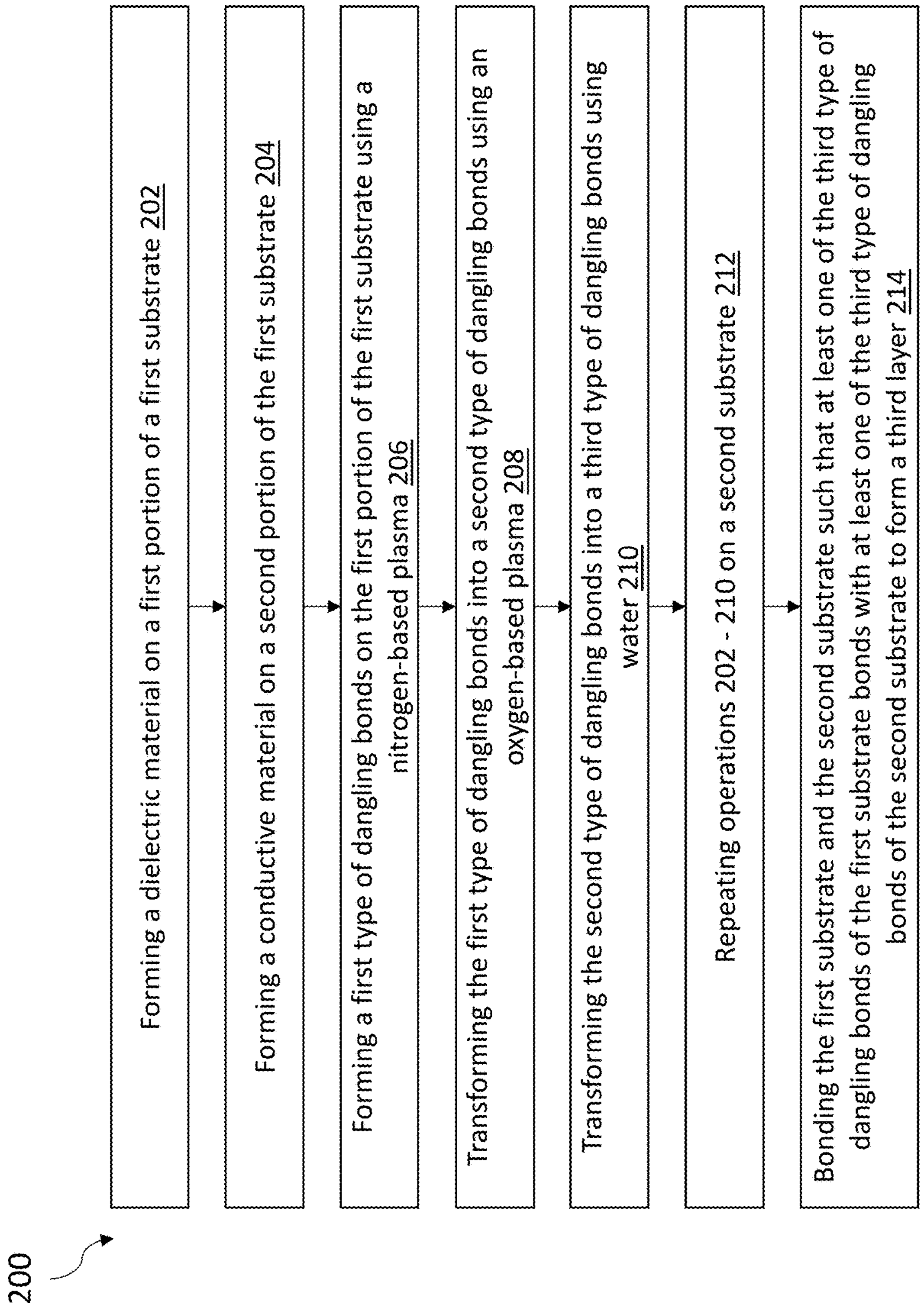
FIG. 2 shows a flow chart of a method for fabricating a semiconductor device, according to an embodiment.

Now referring to FIG. 2, the method 200 starts with operation 202 of forming a dielectric material on a first portion of a first substrate. The method 200 continues to operation 204 of forming a conductive material on a second portion of the first substrate. The method 200 continues to operation 206 of forming a first type of dangling bonds on the first portion of the first substrate using a nitrogen-based plasma. The method 200 continues to operation 208 of transforming the first type of dangling bonds into a second type of dangling bonds using an oxygen-based plasma. The method 200 continues to operation 210 of transforming the second type of dangling bonds into a third type of dangling bonds using water. The method 200 continues to operation 212 of repeating operations 202-210 on a second substrate. The method 200 continues to operation 214 of bonding the first substrate and the second substrate such that at least one of the third type of dangling bonds of the first substrate bonds with at least one of the third type of dangling bonds of the second substrate to form a third layer.

Figure 9:
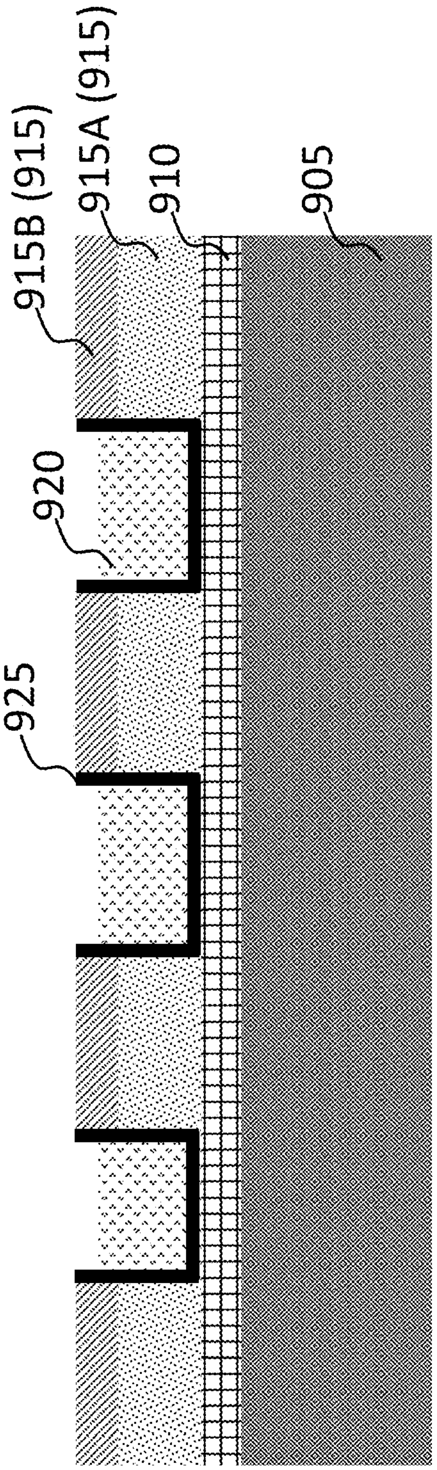

Corresponding to operation 202 of FIG. 2, FIG. 9 is a cross-sectional view of a structure 900 in which a dielectric structure 915 is formed in a first portion of a substrate 905.

The substrate 905 may be a semiconductor substrate, such as a bulk semiconductor, a semiconductor-on-insulator (SOI) substrate, or the like, which may be doped (e.g., with a p-type or an n-type dopant) or undoped. The substrate 905 may be a wafer, such as a silicon wafer. Other substrates, such as a multi-layered or gradient substrate may also be used. In some examples, as depicted in FIG. 9, the substrate 905 may include an interlayer dielectric 910 (e.g., silicon oxide, SiCN, or otherwise low-k dielectric material). In another example, the substrate 905 may be a portion of a 3D NAND memory device, and the substrate 905 may include a stack of different dielectric materials (e.g., oxide-nitride-oxide-nitride (ONON)) alternately arranged on top of one another. The thickness of such a stack layer may vary. For example, the thickness of the ONON layer may be around 8 μm.

The substrate 905 includes a semiconductor material, such as a bulk semiconductor, a semiconductor-on-insulator (SOI), or the like, which may be doped (e.g., with a p-type or an n-type dopant) or undoped. The substrate 905 may be or correspond to a wafer, such as a silicon wafer. Generally, an SOI includes a layer of a semiconductor material formed on an insulator layer. The insulator layer may be, for example, a buried oxide (BOX) layer, a silicon oxide layer, or the like. The substrate 905 may include other semiconductor materials, such as a multi-layered or gradient semiconductor material. In some examples, the substrate 905 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

As shown in FIG. 9, the dielectric structure 915 can be formed in a first portion of the substrate 905 (or the interlayer dielectric 910) of the structure 900. The dielectric structure 915 may be or include a nitride layer, including SiCN, SiN, AlN, BN, TiN, TaN, etc. In some examples, the dielectric structure 915 includes a first dielectric structure 915A and a second dielectric structure 915B. The first dielectric structure 900A may comprise a tetraethyl orthosilicate, an inorganic material, or the like. The second dielectric structure 900B may be or include a nitride layer, including SiCN, SiN, AlN, BN, TiN, TaN, etc. The dielectric structure 915 may be formed or deposited using at least one suitable deposition technique, such as chemical vapor deposition (CVD), flowable CVD (FCVD), atomic layer deposition (ALD), spin coating, the like, or combinations thereof.

Still referring to FIG. 9, in operation 204, a conductive structure 920 is formed on a second portion of the structure 900. The conductive structure 920 includes a conductive material, such as Cu, tungsten (W), nickel (Ni), aluminum (Al), ruthenium (Ru), silver (Ag), gold (Au), platinum (Pt), titanium (Ti), tantalum (Ta), TiN, TaN, the like, or combinations thereof.

In some examples, as shown in FIG. 9, the conductive structure 920 is disposed in an interconnect structure 925, which allows for insulation of the conductive structure 920. The interconnect structure 925 may be or include insulating materials, such as oxide, nitride, carbide, the like, or combinations thereof. The device features and the interconnect structures may be formed within intervening dielectric layers (e.g., intermetal dielectric layers, interlevel/interlayer dielectric layers, etch-stop layers, etc.) as a part of an FEOL process, middle-end-of-line (MEOL) process, or BEOL process.

Figure 10:
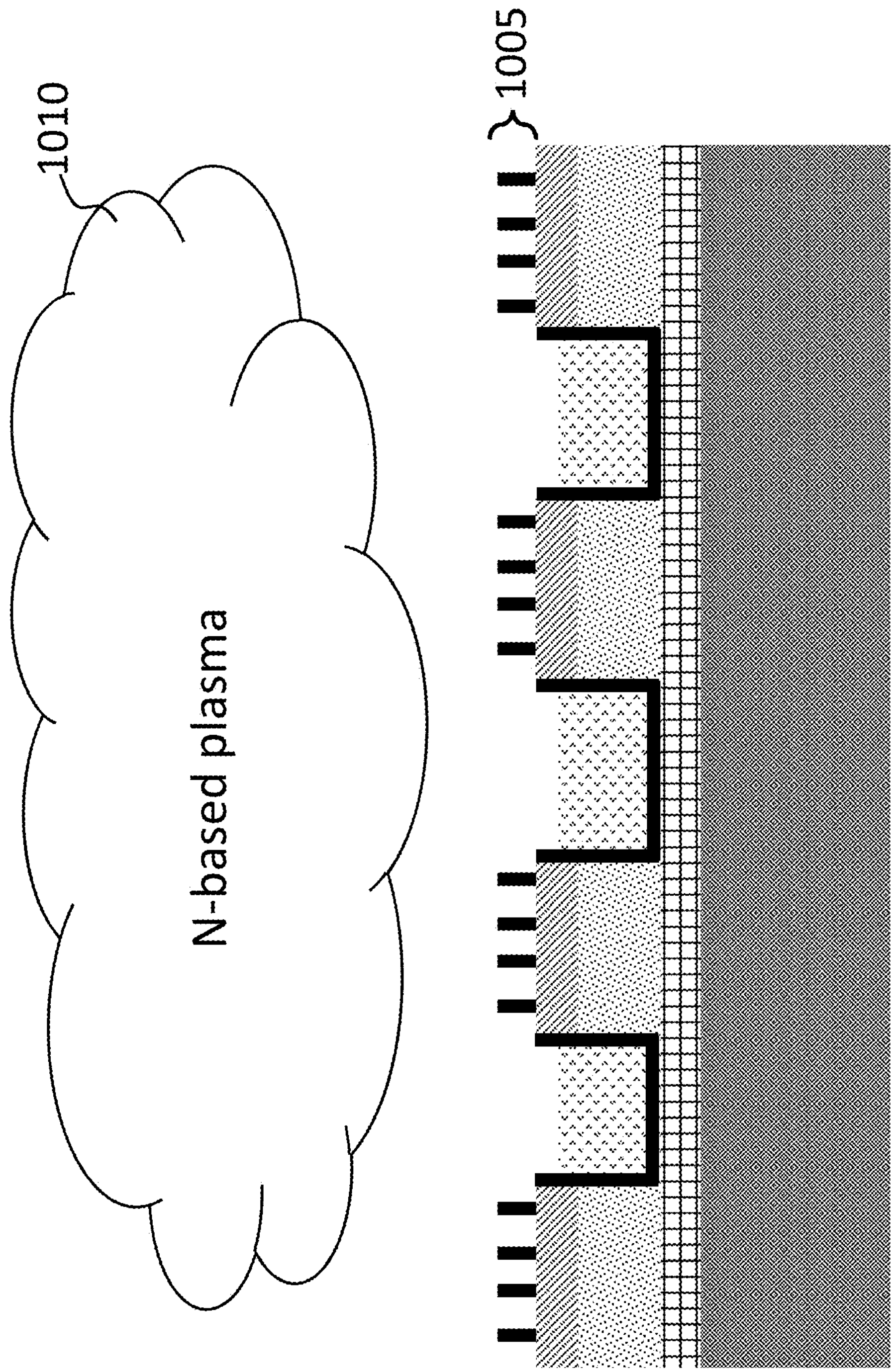

Corresponding to operation 206 of FIG. 2, FIG. 10 shows the structure 1000 in which a first type of dangling bonds 1005 is formed on the dielectric structure 915 of the structure 1000. The first type of dangling bonds 1005 may be or include a nitrogen dangling bond. The first type of dangling bonds 1005 can be formed on the dielectric structure 915 using a nitrogen-based plasma 1010.

Figure 11:
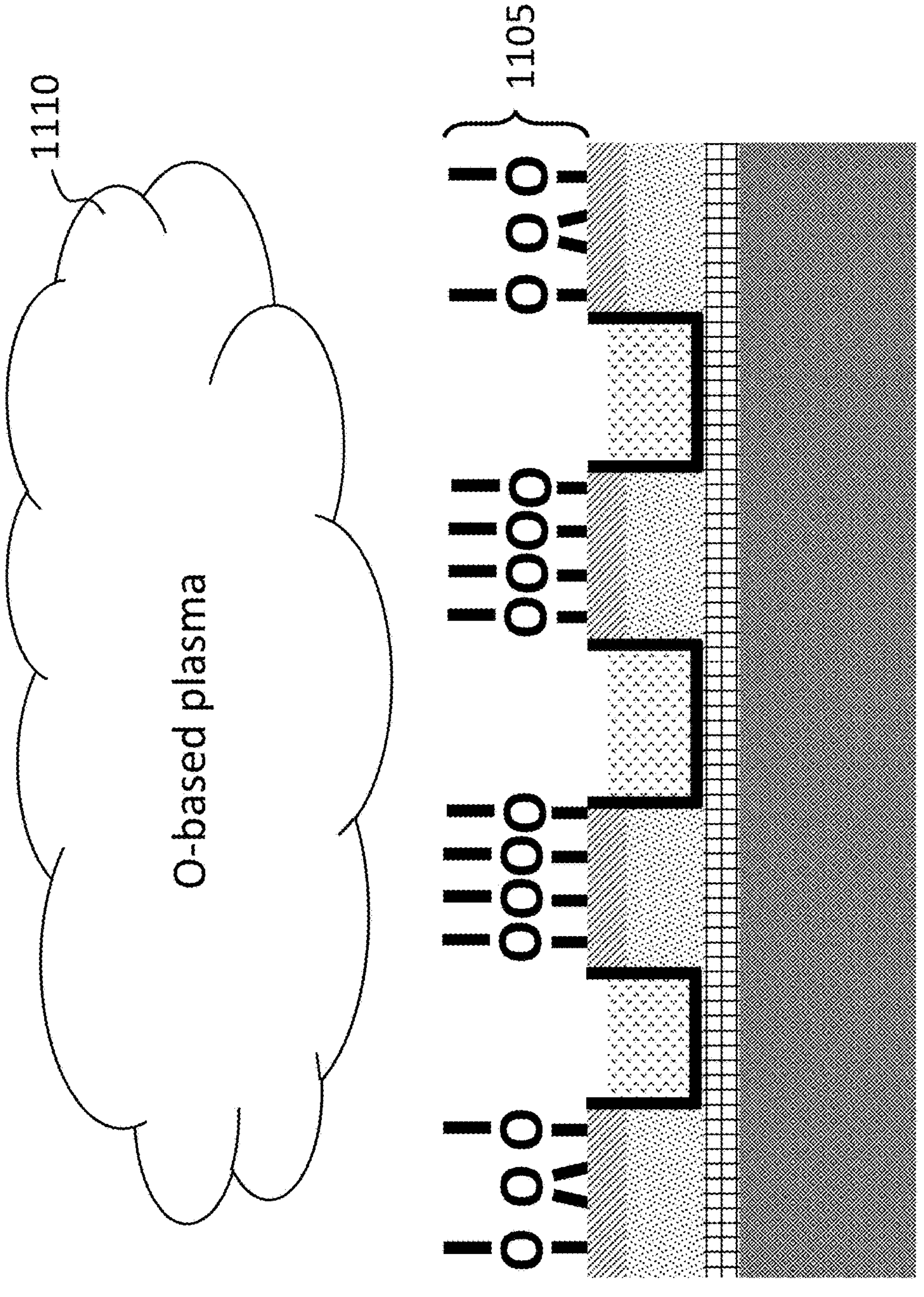

Corresponding to operation 208 of FIG. 2, FIG. 11 shows the structure 1000 in which a second type of dangling bonds 1105 is formed on the dielectric structure 915. The second type of dangling bonds 1105 may be or include an oxygen dangling bond, as shown in FIG. 11. The second type of dangling bonds 1105 can be formed on the dielectric structure 915 using an oxygen-based plasma 1110, for example, by transforming the first type of dangling bonds 1005. In some examples, when the operation 206 is omitted, the second type of dangling bonds 1105 can be directly formed on the dielectric structure 915.

In some examples, performing the operation 208 may include applying an oxidizer in a gaseous or plasma to the dielectric structure 915 (e.g., the first type of dangling bonds 1005 formed thereon) to chemically transform the first type of dangling bonds 1005 into the second type of dangling bonds 1105, thereby modifying the surface chemistry and/or the surface energy of the surface of the dielectric structure 915. The oxidizer that can be applied during the operation 208 may be or include $O_2$ (e.g., $O_2$ plasma), $O_3$ (e.g., $O_3$ plasma), the like, or combinations thereof.

Figure 12:
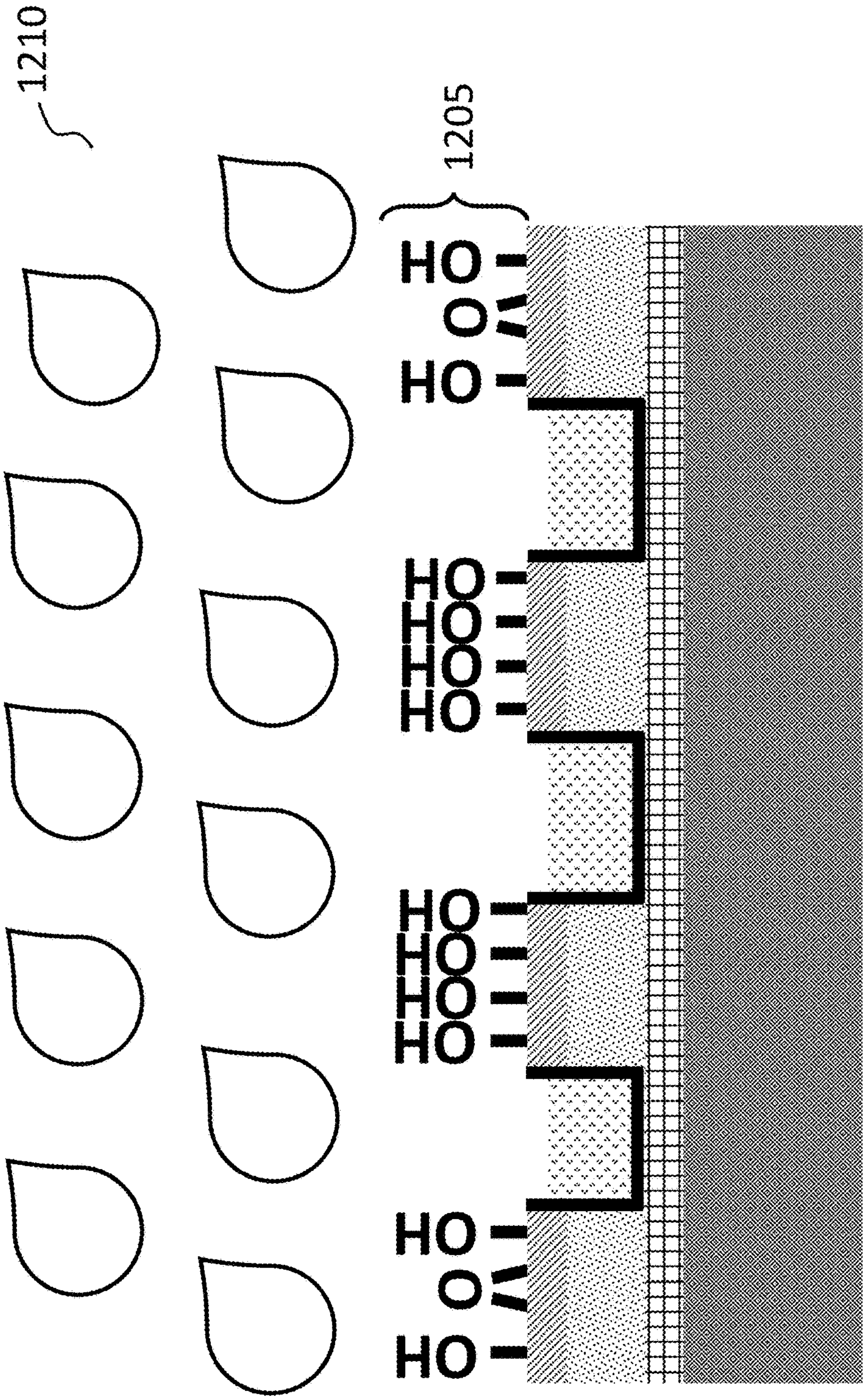

Corresponding to operation 210 of FIG. 2, FIG. 12 shows the structure 1000 in which a third type of dangling bonds 1205 is formed on the dielectric structure 915. The third type of dangling bonds 1205 may be or include a hydroxide dangling bond, as shown in FIG. 12. The third type of dangling bonds 1205 can be formed on the dielectric structure 915 using water treatment 1210 (e.g., scrubber rinse), for example, by transforming/hydroxilizing the second type of dangling bonds 1105. In some examples, when the operation 206 and the operation 208 are omitted, the third type of dangling bonds 1205 can be directly formed on the dielectric structure 915. The third type of dangling bonds 1205 can provide active sites where chemical reactions involving formation of an oxide can occur.

In some examples, the third type of dangling bonds 1205 may include a hydroxyl group of dangling bonds, which can be formed by, for example, transforming the second type of dangling bonds 1105. The third type of dangling bonds 1205 can be coupled to the dielectric structure 915 via an adsorption process, such as water molecules (in the form of water vapor in ambient air) adsorbing onto the dielectric structure 915. In this regard, the third type of dangling bonds 1205 can be coupled to the dielectric structure 915 (e.g., surface thereof) by virtual of exposure in ambient air.

In some examples, performing the operation 210 may include applying an oxidizer in a gaseous or plasma to the dielectric structure 915 (e.g., the second type of dangling bonds 1105 formed thereon) to chemically transform the second type of dangling bonds 1105 into the third type of dangling bonds 1205, thereby modifying the surface chemistry and/or the surface energy of the dielectric structure 915. The oxidizer that can be applied during the operation 210 may be or include $H_2O$ (e.g., liquid or vaporized $H_2O$), etc.

Figure 13:
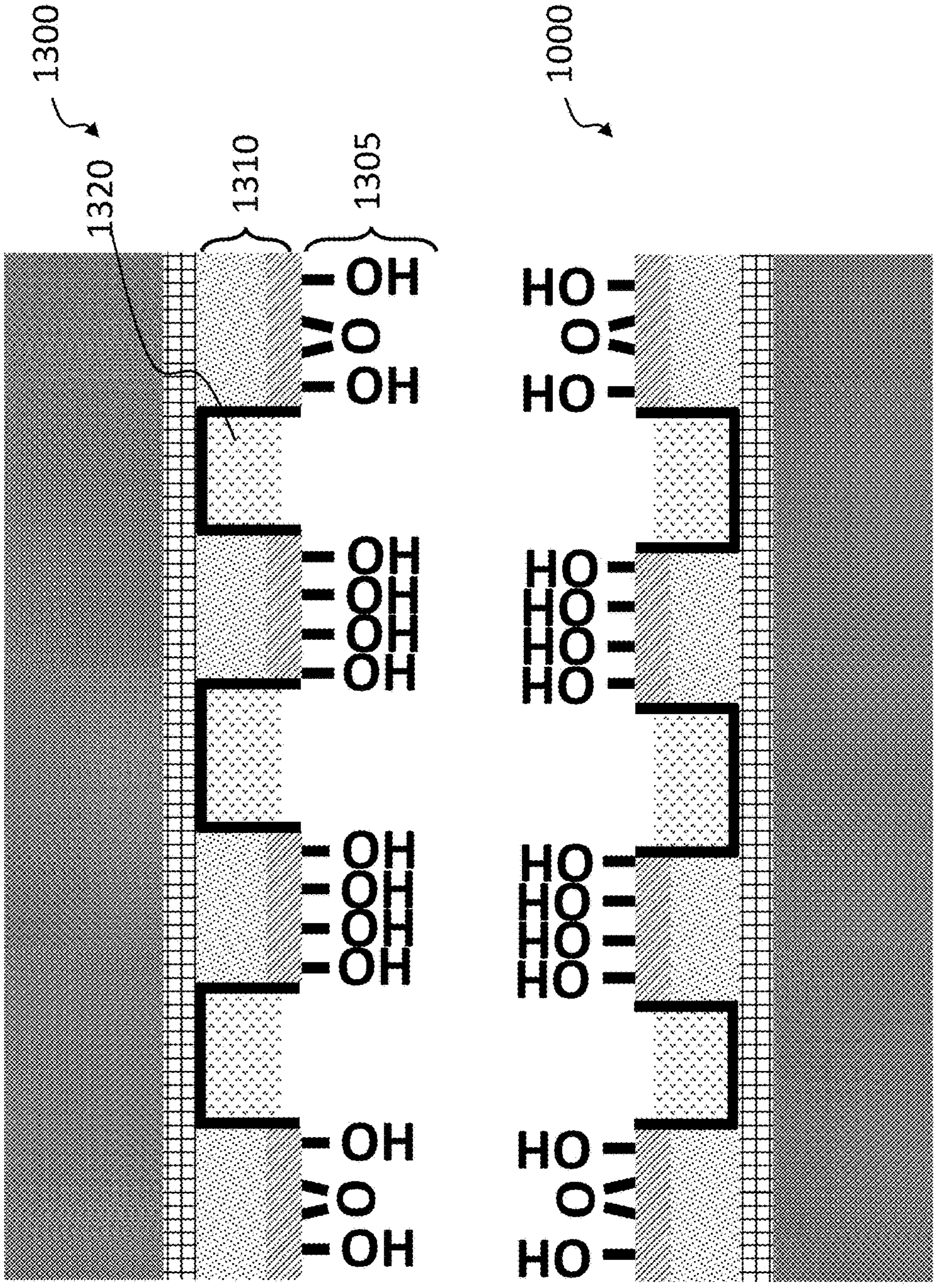

Corresponding to operation 212 of FIG. 2, FIG. 13 shows a cross-sectional view of the structure 1000 and a second structure 1300. In the operation 212, the operation 202 to the operation 210 are repeated on the second structure 1300. The second structure 1300 is substantially similar to or identical to the structure 1000. As shown in FIG. 13, in the operation 212, a third type of dangling bonds 1305 is formed on a dielectric structure 1310 of the second structure 1300.

Figure 14:
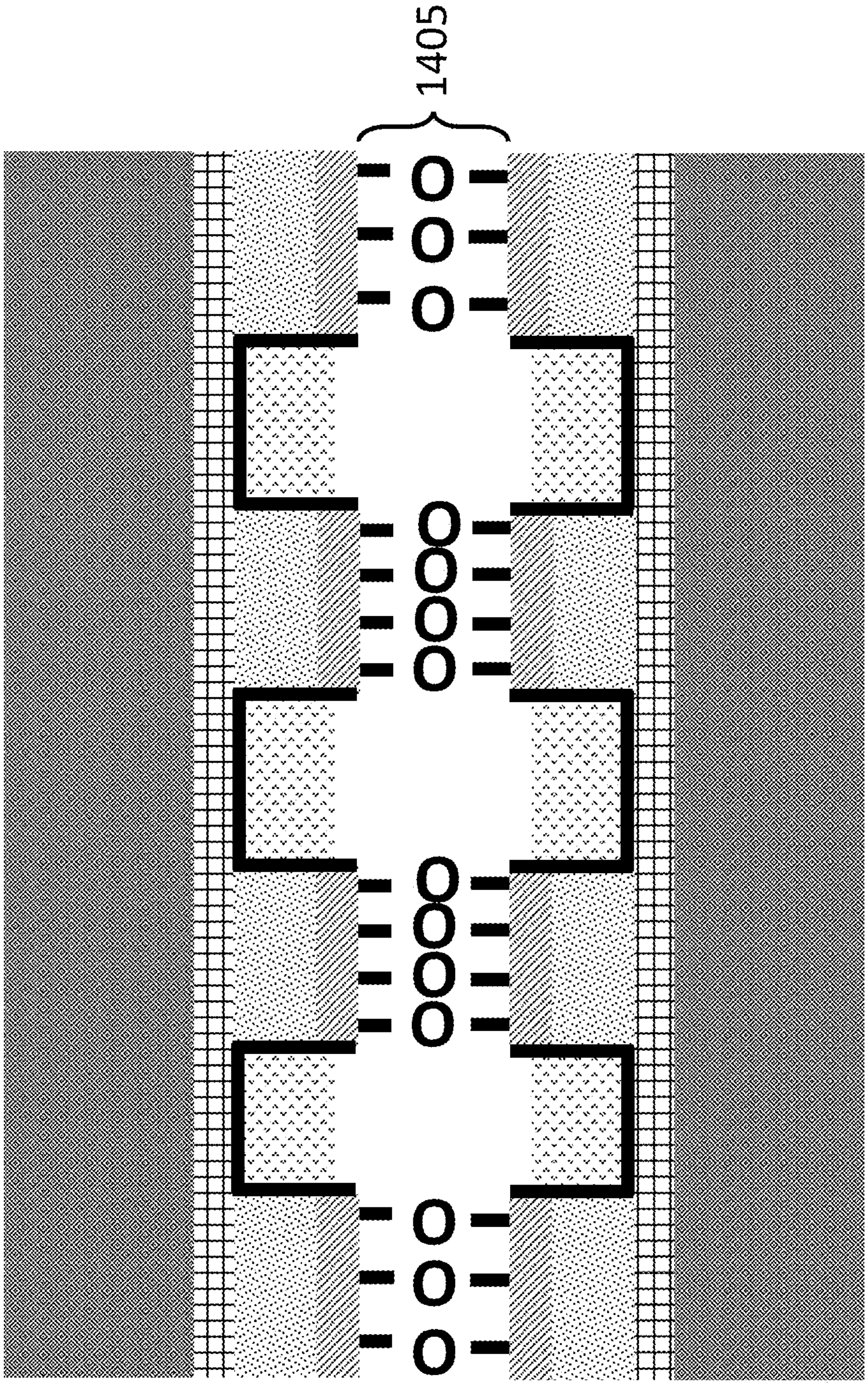

Corresponding to operation 214 of FIG. 2, FIG. 14 shows a cross-sectional view of a bonded structure 1400, which can be formed by bonding the structure 1000 and the second structure 1300. More specifically, in the operation 214, the third type of dangling bonds 1205 of the structure 1000 and the third type of dangling bonds 1305 of the second structure 1300 are bonded to form oxide bonds 1405.

In the operation 214, before bonding the structure 1000 and the second structure 1300, the second structure 1300 (or the structure 1000) is flipped or inverted (e.g., rotated 180°) such that the third type of dangling bonds 1305 of the second structure 1300 and the third type of dangling bonds 1205 of the structure 1000 are placed opposite one another in a face-to-face (e.g., frontside-to-frontside) configuration. For example, the third type of dangling bonds 1305 of the second structure 1300 and the third type of dangling bonds 1205 of the structure 1000 are bonded such that the third type of dangling bonds (e.g., their respective hydroxyl groups) are disposed in close proximity to one another in preparation for the operation 214.

The operation 214 includes aligning and bonding the third type of dangling bonds 1305 of the second structure 1300 and the third type of dangling bonds 1205 of the structure 1000 to form a third layer 1505 (or an interface) between the dielectric structure 915 of the structure 1000 and the dielectric structure 1310 of the second structure 1300. The alignment and bonding of the third type of dangling bonds 1305 of the second structure 1300 and the third type of dangling bonds 1205 of the structure 1000 may be performed according to any suitable process, such as a hybrid bonding process, a fusion bonding process, or a direct bonding process.

As a result of the operation 214, $H_2O$ can be formed as a byproduct and separated out from the bonded structure 1400. Referring to FIG. 14, the operation 214 is applied to make physical and direct contact between the third type of dangling bonds 1305 of the second structure 1300 and the third type of dangling bonds 1205 of the structure 1000, resulting in their third type of dangling bonds (e.g., the hydroxyl groups) to chemically react according to Scheme I as discussed above.

Figure 15:
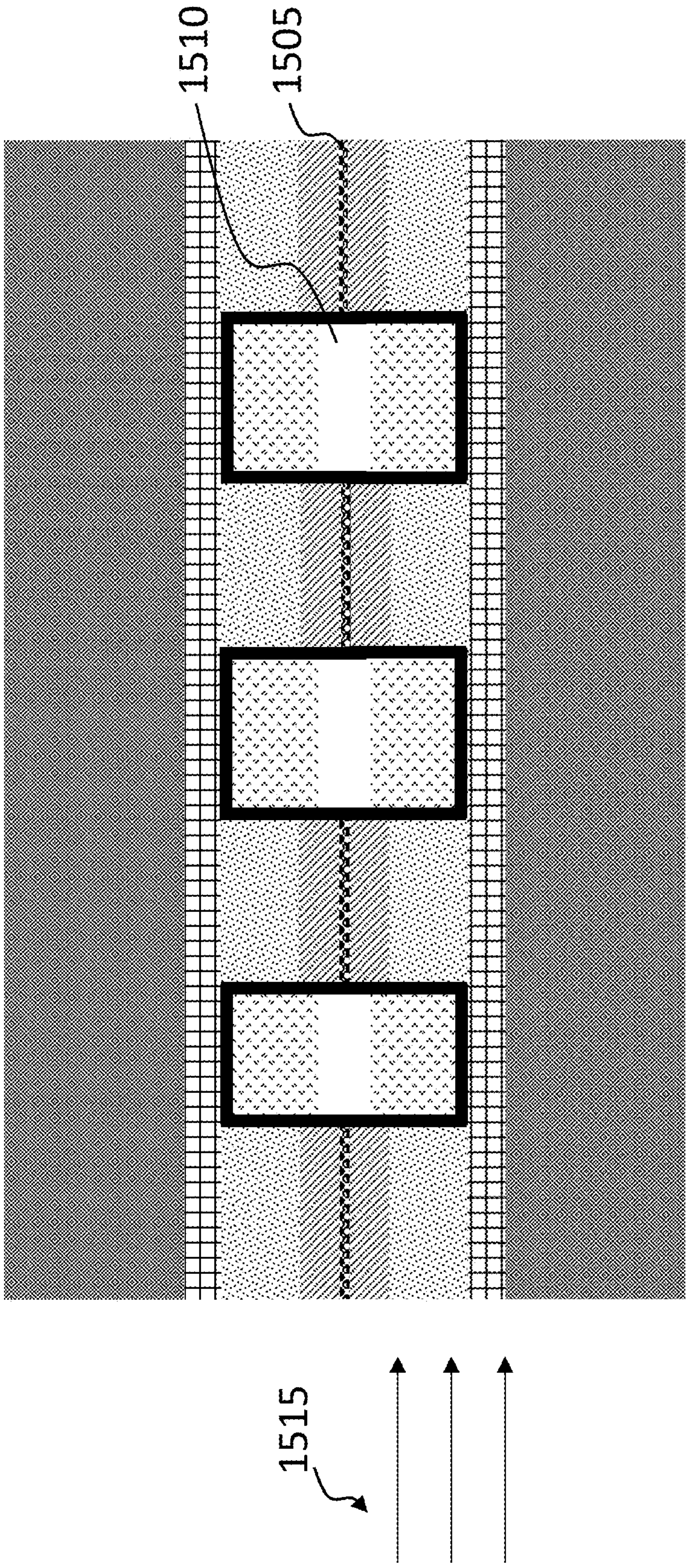

Accordingly, now referring to FIG. 15, the third layer 1505 can be formed between the dielectric structure 915 and the dielectric structure 1310. In some examples, the operation 214 may include performing thermal treatment (e.g., an annealing process) 1515 to anneal the bonded structure 1500 to form the third layer 1505 (e.g., an oxide layer). In some examples, the bonded structure 1500 may include a portion 1510 between the conductive structure 920 of the structure 1000 and the conductive structure 1320 of the second structure 1300. The thermal treatment 1515 can be performed to fill the portion 1510 by allowing conductive materials in the conductive structure 920 of the structure 1000 and/or the conductive structure 1320 of the second structure 1300 to flow/diffuse into the portion 1510. In some examples, the thermal treatment 1515 can be performed under any conditions that allow the conductive structure 920 of the structure 1000 and the conductive structure 1320 of the second structure 1300 to fill the portion 1510 (or form a bonded conductive structure 1605 shown in FIG. 16). For example, the anneal temperature for the thermal treatment can be high enough for the materials of the conductive structures 920, 1320 (e.g., Cu) to expand to fill the portion 1510 and contact each other, thereby forming a bond (e.g., forming the bonded conductive structure 1605).

Figure 16:
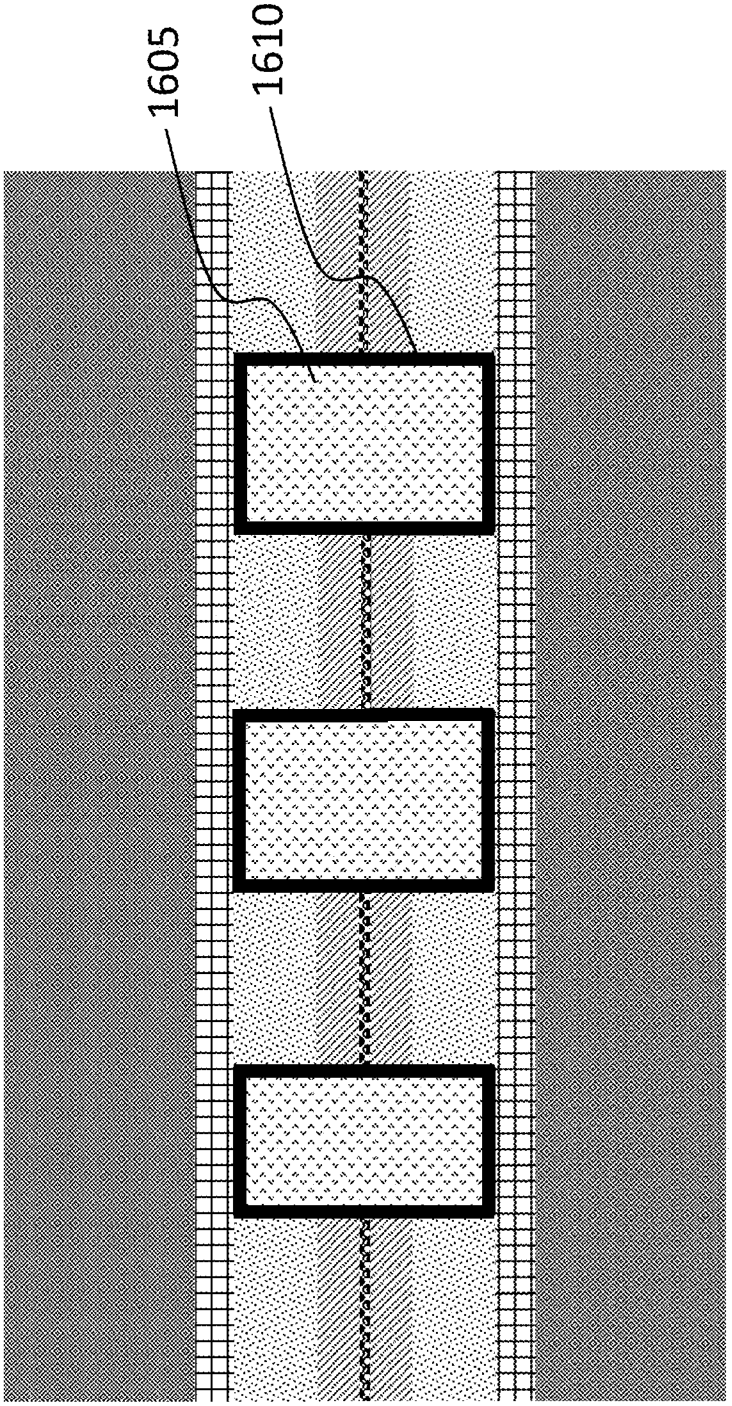

Now referring to FIG. 16, the bonded structure 1500 is shown to have the portion 1510 filled with the conductive material of the conductive structure 920 and/or the conductive structure 1320, thereby forming the bonded conductive structure 1605. As shown in FIG. 16, the interconnect barriers of the structure 1000 and the second structure 1300 forms a bonded interconnect barrier 1610. The bonded interconnect barrier 1610 can serve as a diffusion barrier. That is, the bonded interconnect barrier 1610 can prevent the conductive material of the bonded conductive structure 1605 from diffusing out into the surrounding dielectric layers/structures (e.g., 910, 915, 1310, etc.).

Figure 17:
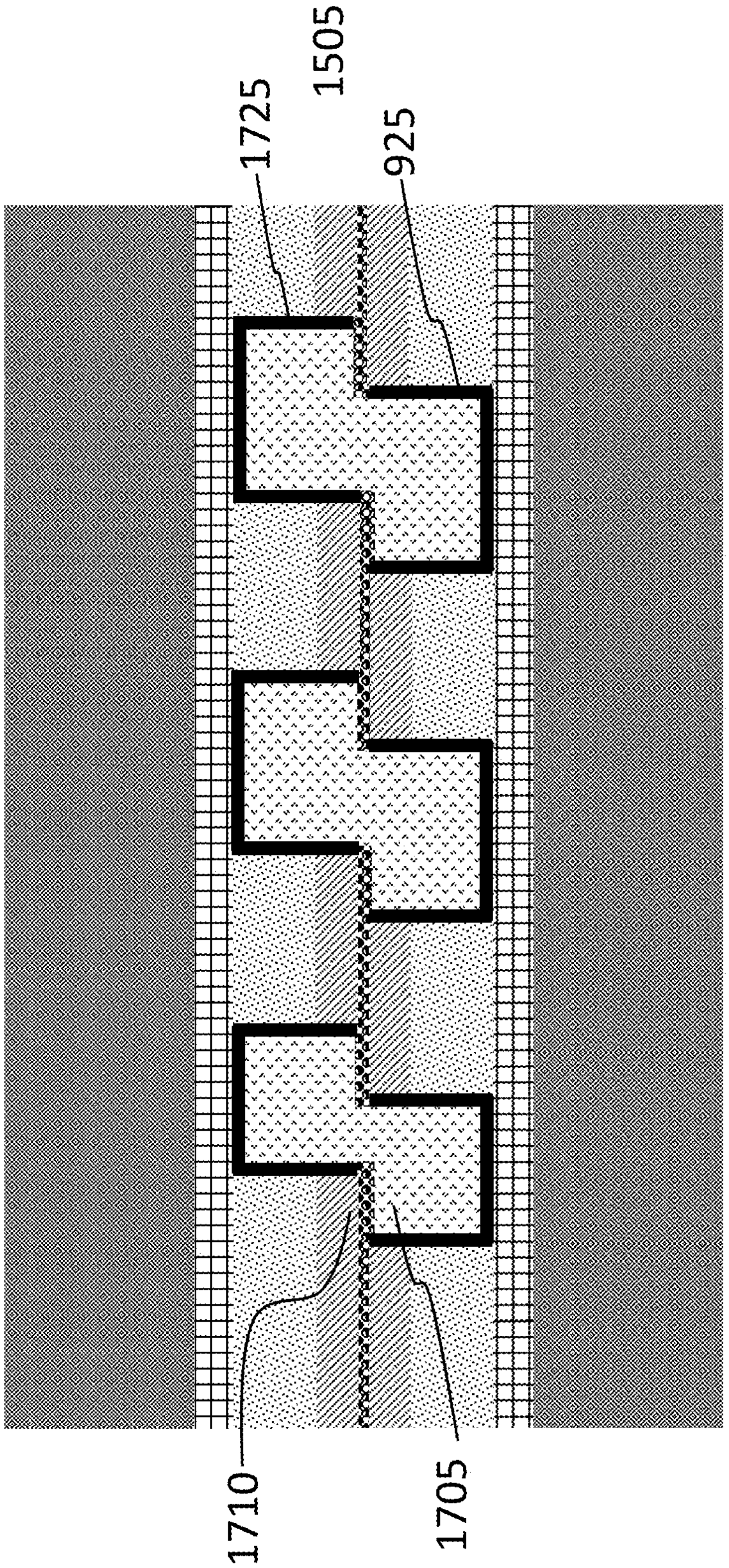

In some examples, when bonding the structure 1000 and the second structure 1300 in the operation 214, the two structures may be mis-aligned. In other words, as shown in FIG. 17, the conductive structure 920 of the structure 1000 does not align with the conductive structure 1320 of the second structure 1300, and a mis-aligned portion 1710 is defined where the interconnect structure 1725 and the interconnect structure 925 are not directly connected. Instead, the interconnect structure 1725 of the second structure 1300 is connected to the interconnect structure 925 of the structure 1000 through the third layer 1505 formed in the mis-aligned portion 1710. These connected structures (e.g., the interconnect structure 1725, the interconnect structure 925, the third layer 1505) can serve as a diffusion barrier. That is, the interconnect structures (e.g., 925, 1725) and the third layer 1505 can prevent the conductive materials in a bonded conductive structure 1705 from diffusing out into the surrounding dielectric layers/structures (e.g., 910, 915, 1310, etc.). Specifically, the third layer 1505 can prevent the conductive materials in the bonded conductive structure 1705 from diffusing out through the mis-aligned portion 1710. This allows for improved bond strength of the interfacial diffusion barrier thereby improving performance of the diffusion barrier.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method for fabricating a semiconductor device, comprising:

forming a first layer on a first substrate;

treating the first layer with a nitrogen-based plasma to form a first type of dangling bonds;

treating the first layer with an oxygen-based plasma to transform the first type of dangling bonds into a second type of dangling bonds; and treating the first layer with water to transform the second type of dangling bonds into a third type of dangling bonds.

2. The method of claim 1, further comprising:

forming a second layer on a second substrate;

treating the second layer with a nitrogen-based plasma to form the first type of dangling bonds;

treating the second layer with an oxygen-based plasma to transform the first type of dangling bonds into the second type of dangling bonds; and treating the second layer with water to transform the second type of dangling bonds into the third type of dangling bonds.

3. The method of claim 2, further comprising:

bonding the first substrate and the second substrate such that the third type of dangling bonds of each substrate forms a third layer between the first layer and the second layer.

4. The method of claim 2, wherein the third layer is an oxide layer.

5. The method of claim 1, wherein:

the first layer is a nitride-based material;

the first type of dangling bonds is a nitrogen-based dangling bond;

the second type of dangling bonds is an oxygen-based dangling bond; and the third type of dangling bonds is a hydroxide-based dangling bond.

6. The method of claim 5, wherein the nitride-based material is at least one of SiCN, SiN, BN, AlN, TiN, or TaN.

7. The method of claim 1, wherein:

the bonding of the first substrate and the second substrate is performed by a wafer-to-wafer bonding or by a die-to-wafer bonding.

8. A method for fabricating a semiconductor device, comprising:

forming a first layer on a first substrate;

forming a second layer on a second substrate;

forming a first type of dangling bonds on the first layer of the first substrate and on the second layer of the second substrate;

transforming the first type of dangling bonds on the first layer of the first substrate and on the second layer of the second substrate into a second type of dangling bonds;

transforming the second type of dangling bonds on the first layer of the first substrate and on the second layer of the second substrate into a third type of dangling bonds; and bonding the third type of dangling bonds on the first layer of the first substrate with the third type of dangling bonds on the second layer of the second substrate.

9. The method of claim 8, wherein the bonding of the third type of dangling bonds on the first layer of the first substrate and the third type of dangling bonds on the second layer of the second substrate forms a third layer.

10. The method of claim 9, wherein the third layer is an oxide layer.

11. The method of claim 8, comprising:

treating the first layer and the second layer with a $N_2$ plasma to form the first type of dangling bonds;

treating the first type of dangling bonds with an $O_2$ plasma to transform the first type of dangling bonds into the second type of dangling bonds; and treating the second type of dangling bonds with water to transform the second type of dangling bonds into the third type of dangling bonds.

12. The method of claim 11, wherein:

the first type of dangling bonds is a nitrogen-based dangling bond;

the second type of dangling bonds is an oxygen-based dangling bond; and the third type of dangling bonds is a hydroxide-based dangling bond.

13. A method for fabricating a semiconductor device, comprising:

forming a dielectric material on a first portion of a first substrate;

forming the dielectric material on a first portion of a second substrate;

forming a conductive material on a second portion of the first substrate;

forming the conductive material on a second portion of the second substrate;

forming dangling bonds on the first portion of the first substrate;

forming dangling bonds on the first portion of the second substrate; and bonding the first substrate and the second substrate such that at least one of the dangling bonds on the first portion of the first substrate bonds with at least one of the dangling bonds on the first portion of the second substrate to form an oxide.

14. The method of claim 13, wherein the forming of dangling bonds on the first portion of the first substrate and the forming of dangling bonds on the first portion of the second substrate comprises:

forming nitrogen-based dangling bonds on the dielectric material on the first portion of the first substrate and on the dielectric material on the first portion of the second substrate;

transforming the nitrogen-based dangling bonds into oxygen-based dangling bonds; and transforming the oxygen-based dangling bonds into hydroxide-based dangling bonds.

15. The method of claim 14, further comprising:

treating the dielectric material on the first portion of the first substrate and on the dielectric material on the first portion of the second substrate with an $N_2$ plasma to form the nitrogen-based dangling bonds;

treating the nitrogen-based dangling bonds with an $O_2$ plasma to transform the nitrogen-based dangling bonds into the oxygen-based dangling bonds; and treating the oxygen-based dangling bonds with water to transform the oxygen-based dangling bonds into the hydroxide-based dangling bonds.

16. The method of claim 13, further comprising:

forming an interconnect material on a bottom portion and sidewalls of the second portion of the first substrate; and forming the interconnect material on a bottom portion and sidewalls of the second portion of the second substrate.

17. The method of claim 16, wherein the interconnect material formed on the second portion of the first substrate, the interconnect material formed on the second portion of the second substrate, and the oxide form a diffusion barrier.

18. The method of claim 17, wherein the interconnect material formed on the second portion of the first substrate is connected to the interconnect material formed on the second portion of the second substrate through the oxide.

19. The method of claim 13, wherein the oxide prevents the conductive material in the second portion of the first substrate from diffusing into the first portion of the second substrate.

20. The method of claim 13, wherein the dielectric material comprises tetraethyl orthosilicate and at least one of SiCN, SiN, BN, AlN, TiN, or TaN.

* * * * *